United States Patent
Vogt et al.

(10) Patent No.: US 8,168,086 B2
(45) Date of Patent: May 1, 2012

(54) INORGANIC LUMINESCENT PHOSPHOR MATERIALS FOR LIGHTING

(75) Inventors: Thomas Vogt, Chapin, SC (US); Sangmoon Park, Busan (KR)

(73) Assignee: University of South Carolina, Columbia, SC (US)

( * ) Notice: Subject to any disclaimer, the term of this patent is extended or adjusted under 35 U.S.C. 154(b) by 435 days.

(21) Appl. No.: 12/476,652

(22) Filed: Jun. 2, 2009

(65) Prior Publication Data

US 2009/0302236 A1 Dec. 10, 2009

Related U.S. Application Data

(60) Provisional application No. 61/130,736, filed on Jun. 3, 2008.

(51) Int. Cl.
*C09K 11/61* (2006.01)

(52) U.S. Cl. ............ 252/301.4 H; 252/301.5; 313/483; 313/486

(58) Field of Classification Search ........... 252/301.4 H, 252/301.5; 313/483, 486
See application file for complete search history.

(56) References Cited

U.S. PATENT DOCUMENTS

| | | | |
|---|---|---|---|
| 6,924,233 B1 | 8/2005 | Chua et al. | |
| 6,982,045 B2 | 1/2006 | Menkara et al. | |
| 6,987,353 B2 | 1/2006 | Menkara et al. | |
| 7,109,648 B2 | 9/2006 | Menkara et al. | |
| 7,112,921 B2 | 9/2006 | Menkara et al. | |
| 2009/0127508 A1 | 5/2009 | Kubel | |
| 2009/0174310 A1 | 7/2009 | Vogt | |
| 2009/0212314 A1 | 8/2009 | Im et al. | |

OTHER PUBLICATIONS

Prodjosantoso, et al., Cation and anion ordering in the layered oxyfluorides $Sr_{3-x}A_xAIO_4F$ (A=Ba, Ca), *Journal of Solid State Chemistry*, 172 (2003), pp. 89-94.
Vogt, et al., Brief Communication, "$Sr_3MO_4F$ (M=Al,Ga)—A New Family of Ordered Oxyfluorides" *Journal of Solid State Chemistry*, 144, pp. 228-231 (1999).
Citation of U.S. Appl. No. 12/348,910.

*Primary Examiner* — Carol M Koslow
(74) *Attorney, Agent, or Firm* — Dority & Manning, P.A.

(57) ABSTRACT

A light emitting device comprising a light producing element configured to generate ultraviolet light having a wavelength of from about 250 nm to about 400 nm and a self-activating phosphor comprising an ordered oxyfluoride compound is provided. The nitrogen-free or nitrogen-containing ordered oxyfluoride compound has a formula:

$$A_{3-3a/2}R_aMO_{4-\delta1-w}F_{1-\delta2-w'}-N_{w''}$$

where A is Sr alone or Sr mixed with Ba and/or Ca such that A comprises at least about ⅔ mole % of Sr and up to about ⅓ mole percent of Ba and/or Ca; R is a rare earth element or a mixture of rare earth elements; M is Al, Ga, In, W, Mo, Bi, or mixtures thereof; $0<a\leq 0.3$; $\delta1$ and $\delta2$ are both from about 0.01 to about 0.1; and $0\leq w \leq 0.05$ such that $0\leq w'\leq 0.1$ and $0\leq w''\leq 0.15$. The ultraviolet light excites the self-activating phosphor such that the self-activating phosphor emits visible light having a wavelength of from about 380 to about 750 nm.

15 Claims, 8 Drawing Sheets

INORGANIC LUMINESCENT PHOSPHOR MATERIALS FOR LIGHTING

PRIORITY INFORMATION

The present application claims priority to U.S. Provisional Patent Application Ser. No. 61/130,736 filed on Jun. 3, 2008, the disclosure of which is incorporated by reference herein.

BACKGROUND OF INVENTION

Nearly 25% of the total world wide energy consumption in 2005 was used in the US. A third of the 100.2 quadrillion British Thermal Units ('quads') total US energy consumption is used for electricity. About 25% of the electricity in the US is used for lighting. About 8% of the total worldwide energy used is transformed into artificial lighting. Currently, inefficient incandescent lighting (efficiency ~5%) is being replaced by fluorescent lighting (compact fluorescent lights CFL at an efficiency ~25%) and solid state lighting (light emitting devices or "LEDs") to reduce our carbon footprint.

The quantum efficiency of light-emitting devices based on photon conversion is the ratio of the number of emitted photons divided by the number of absorbed photons. The potential increase of the efficiency of fluorescent lamps from 25 to 40% would translate into commensurate energy savings and provide a technology platform before advanced light-emitting diode (LED) technologies can significantly penetrate the market.

A light-emitting phosphor can include a host lattice into which activator ions such as rare earths are doped at a few mol %. Certain lattices are self-activating and emit light without the presence of activators. Particular electronic energy levels of the activator ions can be populated either directly by excitation or indirectly via energy transfers inducing luminescence and non-radiative decay processes. Luminescence is a process in which a higher energy photon (typically from the UV region between 200-400 nm) is absorbed and a lower energy photon is emitted in the visible region of the electromagnetic spectrum between 400 and 750 nm. This process is also referred to as a Stoke's process, and the difference in wavelength as the Stoke's shift.

Generally, two types of activator ions exist: those that interact weakly with the host lattice via their f-electron energy levels and those that interact strongly with it via their $s^2$ and/or d-electrons. In the first case, rare earth ions ($RE^{n+}$, n=2,3) allow optical transitions between their different discrete energy levels resulting in narrow line emissions as seen, for example, in $Y_2O_3:Eu^{3+}$, whereas in $s^2$ ions such as $Pb^{2+}$ or $Sb^{3+}$ and transitions metals such as $Mn^{2+}$ broad bands of radiation are emitted. As an example, in $Eu^{3+}$ activated phosphors such as $Y_2O_3:Eu^{3+}$, ultraviolet (UV) photons are absorbed through a charge-transfer process. Subsequently, this energy is transferred to the f-energy levels of $Eu^{3+}$, which are then deactivated and thereby reveal a characteristic f-f emission line spectra ($^5D_j \rightarrow {}^7F_j$). The host lattice must be optically transparent, since we want the absorption-excitation process to take place in the bulk at the doped activator site.

About 90% of all artificially-generated photons come from discharge lamps generating UV light, the most widespread being those based on Hg plasma with 75% conversion efficiency. The low pressure Hg plasma has three main emission lines at 185, 254 and 365 nm. If the pressure is increased above 1000 torr, a continuum between 250 and 350 nm is created by the Hg discharge. Low-pressure Hg discharge lamps coupled with a phosphor coating have an energy conversion efficiency of about 25-30%.

A phosphor emits light in a narrow frequency range, unlike an incandescent filament, which emits the full spectrum, though not all colors equally, of visible light. Mono-phosphor lamps emit poor quality light with a low color rendering index. One solution is to mix different phosphors, each emitting a different range of light. Properly mixed, a good approximation of daylight or incandescent light can be achieved. However, every extra phosphor added to the coating mix causes a loss of efficiency and increases manufacturing costs. Good-quality consumer CFLs use three or four phosphors—typically emitting light in the red, green and blue spectra—to achieve a "white" light with color-rendering indices (CRI) of around 80 although CFLs with a CRI as great as 96 have been developed. (A CRI of 100 represents the most accurate reproduction of all colors; reference sources having a CRI of 100, such as the sun and incandescent tungsten lamps, emit black body radiation.)

These phosphors are generally activated at wavelengths around 254 nm (e.g., the 254 nm emission line of low pressure Hg plasma). However, a need exists for phosphors that are activated in the near UV light wavelengths (e.g., around the 360 nm emission line of low pressure Hg plasma).

SUMMARY OF INVENTION

Objects and advantages of the invention will be set forth in part in the following description, or may be obvious from the description, or may be learned through practice of the invention.

A light emitting device comprising a light producing element configured to generate ultraviolet light having a wavelength of from about 250 nm to about 400 nm and a self-activating phosphor comprising an ordered oxyfluoride compound is generally provided. The nitrogen free and nitrogen-containing ordered oxyfluoride compound has a formula:

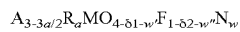

$$A_{3-3a/2}R_aMO_{4-\delta1-w'}F_{1-\delta2-w''}N_w$$

where A is Sr alone or Sr mixed with Ba and/or Ca such that A comprises at least about ⅔ mole % of Sr and up to about ⅓ mole percent of Ba and/or Ca; R is a rare earth element or a mixture of rare earth elements; M is Al, Ga, In, W, Mo, Bi, or mixtures thereof; $0 < a \leq 0.3$; $\delta1$ and $\delta2$ are both from about 0.01 to about 0.1; and $0 \leq w \leq 0.05$ such that $0 \leq w' \leq 0.1$ and $0 \leq w'' \leq 0.15$. The ultraviolet light excites the self-activating phosphor such that the self-activating phosphor emits visible light having a wavelength of from about 380 to about 750 nm.

Other features and aspects of the present invention are discussed in greater detail below.

BRIEF DESCRIPTION OF THE DRAWINGS

A full and enabling disclosure of the present invention, including the best mode thereof to one skilled in the art, is set forth more particularly in the remainder of the specification, which includes reference to the accompanying figures, in which.

DETAILED DESCRIPTION

Figure 1:
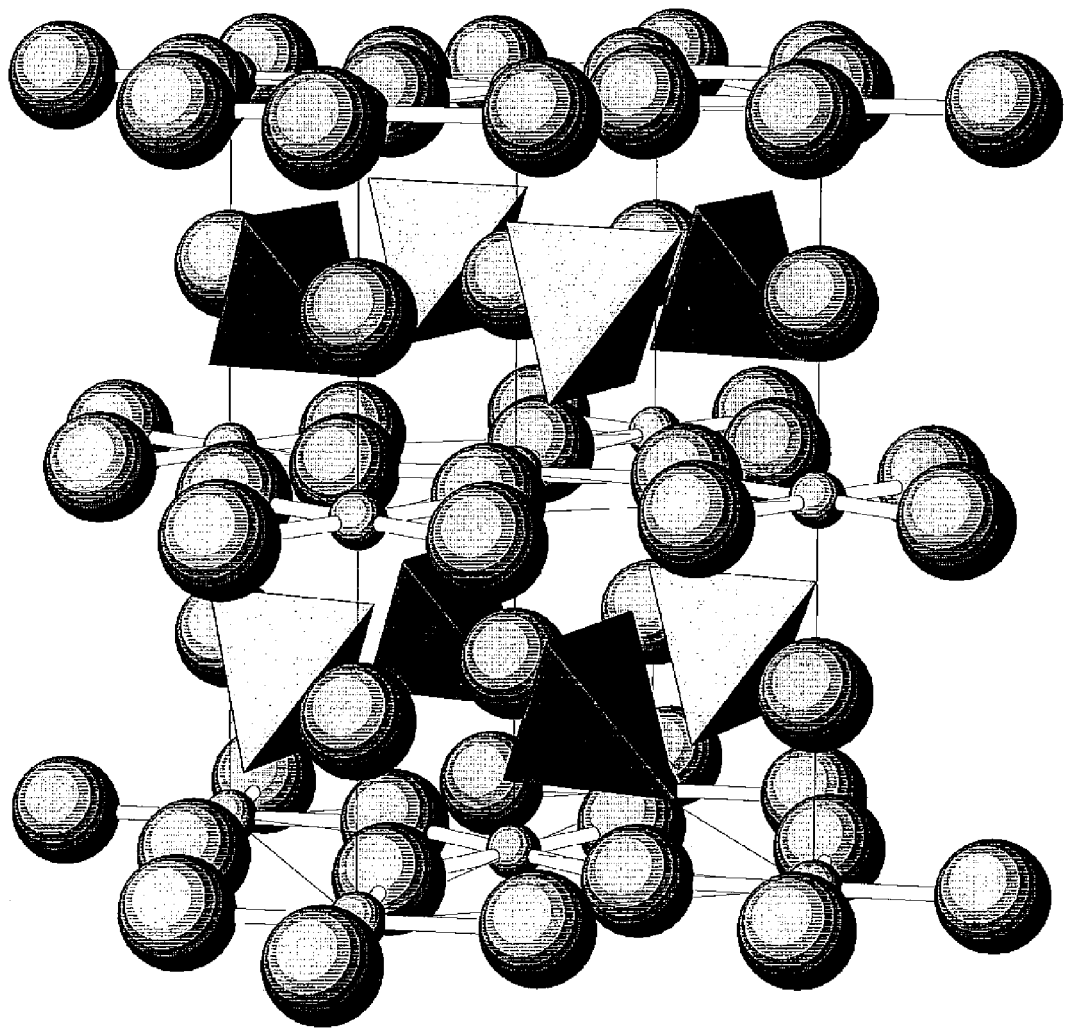
FIG. 1 depicts an exemplary structure of $A_3MO_4F$ revealing the stacked layers separated by isolated $MO_4$ tetrahedra.

Reference now will be made to the embodiments of the invention, one or more examples of which are set forth below. Each example is provided by way of an explanation of the invention, not as a limitation of the invention. In fact, it will be apparent to those skilled in the art that various modifications and variations can be made in the invention without departing from the scope or spirit of the invention. For instance, features illustrated or described as one embodiment can be used on another embodiment to yield still a further embodiment. Thus, it is intended that the present invention cover such modifications and variations as come within the scope of the appended claims and their equivalents. It is to be understood by one of ordinary skill in the art that the present discussion is a description of exemplary embodiments only, and is not intended as limiting the broader aspects of the present invention, which broader aspects are embodied exemplary constructions.

Unless otherwise stated, chemical elements are discussed in the present disclosure using their common chemical abbreviation, such as commonly found on a periodic table of elements. For example, hydrogen is represented by its common chemical abbreviation H; helium is represented by its common chemical abbreviation He; and so forth.

In general, the present disclosure is directed to phosphors for use in light emitting devices. The activator doped phosphors of the present disclosure may be recycled to recover the starting materials, which is especially desirable when including a rare earth element in the phosphors. An oxidizing acid (i.e. $H_2O_2$, HCl, $HNO_3$) in an aqueous solution can degrade the self-activating phosphor and then the elements can be separated using know separation techniques.

I. Ordered Oxyfluoride Compound

One particular embodiment of the present disclosure is directed to a self-activating phosphor including a nitrogen free and nitrogen-containing ordered oxyfluoride compound having the general formula:

$A_{3-3a/2}R_aMO_{4-\delta1-w'}F_{1-\delta2-w''}N_w$ (Formula 1)

where A is Sr alone or Sr mixed with Ba and/or Ca such that A comprises at least about ⅔ mole % of Sr and up to about ⅓ mole percent of Ba and/or Ca; R is a rare earth element or a mixture of rare earth elements; M is Al, Ga, In, W, Mo, Bi, or mixtures thereof; $0 < a \leq 0.3$; $\delta1$ and $\delta2$ are both from about 0.01 to about 0.1; and $0 \leq w \leq 0.05$ such that $0 \leq w' \leq 0.1$ and $0 \leq w'' \leq 0.15$. In one particular embodiment, M can represent Al and/or Ga from about 90 mole % to about 100 mole % combined with from about 0 mole % to about 10 mole % of In, W, Mo, Bi, or a mixture thereof.

When nitrogen is absent (i.e., w=0), then the compound can be more simply represented by the general formula:

$A_{3-3a/2}R_aMO_{4-\delta1}F_{1-\delta2}$ (Formula 2)

where A is Sr alone or Sr mixed with Ba and/or Ca such that A comprises at least about ⅔ mole % of Sr and up to about ⅓ mole percent of Ba and/or Ca; R is a rare earth element or a mixture of rare earth elements; M is Al, Ga, In, W, Mo, Bi, or mixtures thereof; $0 < a \leq 0.3$; and $\delta1$ and $\delta2$ are both from about 0.01 to about 0.1. Nitrogen can be incorporated into this ordered oxyfluoride compound by streaming ammonia over an ordered oxyfluoride compound without any nitrogen present, followed by a subsequent reaction using hydrogen and/or various hydrogen/argon mixtures (creating an oxyfluoridenitride). The difference in charge between nitride (−3) and oxide (−2) and fluoride (−1) drives the relationship between w, w' and w'' of the molecule shown in Formula 1. For example, two nitride anions and a defect hole are substituted for three oxide anions to balance the covalence charge of the resulting compound. Likewise, a nitride anion and two defect holes are substituted for three fluoride anions to balance the covalence charge of the resulting compound.

These ordered oxyfluoride compounds can be formed by creating defects in the oxygen and fluorine containing sub-lattice of an ordered oxyfluoride compound. Introducing defects into the fluorine and oxygen sub-lattice of certain ordered oxyfluoride compounds can provide a compound having desirable luminescence properties particularly useful as phosphors for lighting applications. Additionally, the intensity of the emitted light from the self-activating phosphors can be tailored by controlling the amount of defects in either or both the fluorine and oxygen sub-lattice.

Figure 7:
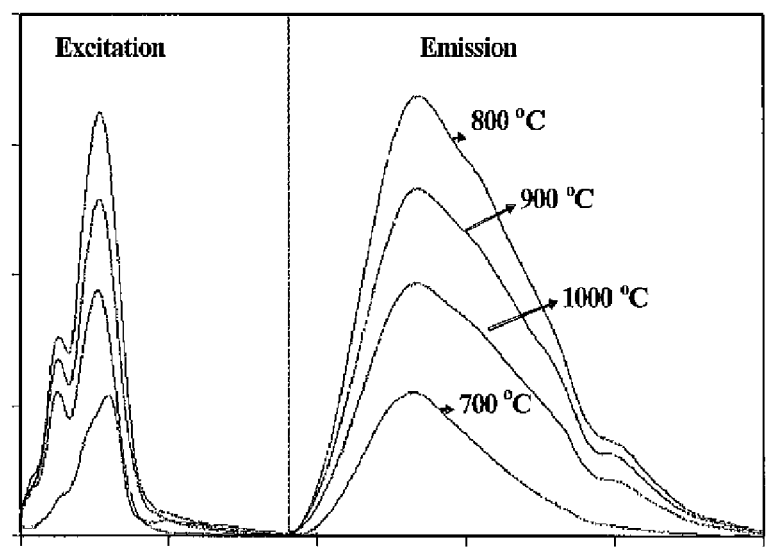
FIG. 7 shows the dependence of visible light emission under 254 nm as a function of post-synthesis temperature conditions of $Sr_3Al\ O_{4-\delta1}F_{1-\delta2}$, with the Y-axis being an arbitrary intensity unit to indicate relative changes due to post-treatment.

Additionally, the intensity of the emitted light from the self-activating phosphors can be tailored by controlling the temperature of the compound, as shown in FIG. 7.

The self-activating phosphor can be formed by doping an ordered oxyfluoride compound to introduce defects into its oxygen and fluorine sub-lattice. The ordered oxyfluoride compound, prior to the introduction of defects in its fluorine sub-lattice, can generally be represented by the formula:

$Sr_{3-x}A_xMO_{4-w'}F_{1-w''}N_w$ (Formula 3)

where A is Ba, Ca, or mixtures thereof; M is Al, Ga, In, W, Mo, Bi, or mixtures thereof; $0 < x \leq 1$; and $0 \leq w \leq 0.05$ such that $0 \leq w' \leq 0.1$ and $0 \leq w'' \leq 0.15$. These compounds crystallize in a layered structure in which the layers made of isolated $MO_4$ tetrahedra contain A cations (e.g., Sr, Ca, Ba, or a combination) and are separated by $Sr_2F^{3+}$ layers, such as represented in FIG. 1. The structure of this compound shown in FIG. 1 has stacked and alternating $A_2F^{3+}$ layers separated by isolated $SrMO_4^{3-}$ layers. Of course, depending on the particular composition of the ordered oxyfluoride compound, the Sr and A positions can vary in the layers. This unusual ordered anion arrangement is believed to be a result of the spatial separation of strong ionic A-F and M-O covalent bonding, respectfully. The nitrogen can be distributed over both anion sub-lattices, but due to both charge and size limitations, the nitrogens are more likely to be in the oxygen containing anion sublattice. In the ordered oxyfluoride compound, the A site is substantially under bonded with a valence sum of 1.30. Thus, it is believed that other cations (such as $Ca^{2+}$ and rare earth cations) can be incorporated into this site. The bond valence of the Sr site (2.22) is much closer to its formal oxidation state of 2. Trivalent rare-earth ions can be substituted into both the Sr and A sites. However, the different valence states of rare-earth ions and alkaline-earth ions require a charge compensation mechanism. As evidenced by the under-bonding in the $Sr_2F^{3+}$ sublattice (bond valence of ~1.3 in Sr case) this host lattice can readily adopt cation vacancies and thus this structure can accommodate significant concentrations of trivalent substitutions according to $Sr_{3-(3a/2)}RE_aMO_4F$.

Particularly suitable ordered oxyfluoride compounds for use as phosphors for lighting applications according to the present disclosure, such as $Sr_3MO_4F$ (where M is Al or Ga) and $Sr_{3-x}A_xMO_4F$ (where A is Ca or Ba, and M is Al or Ga), are discussed in T. Vogt, et al., Journal of Solid State Chemistry 144, 228-231 (1999) and A. K. Prodjosantoso, et al. Journal of Solid State Chemistry 172, 89-94 (2003), respectfully, both of which are incorporated by reference herein.

The defects in the oxygen and fluorine sub-lattice of the ordered oxyfluoride compounds can be introduced to form the presently disclosed self-activating phosphors according to any method. In one embodiment, the ordered oxyfluoride compound in a powder form can be exposed to a reducing gas (e.g., hydrogen, argon or hydrogen/argon mixture gas). The gas can be air or a mixture of particular gases (e.g., Ar, $H_2$, or a mixture thereof, such as Ar:$H_2$::5-10%:85-90% by volume) that can remove oxygen and fluorine atoms from the ordered oxyfluoride compound. Without wishing to be bound by theory, it is believed that the hydrogen gas reduces the self-activating phosphor to remove oxygen and fluorine atoms. Thus, the by-product gas may include water and HF gases.

Reducing the ordered oxyfluoride material can be performed at elevated temperatures to control the amount of defects created, to facilitate the reduction reactions, and to ensure that any by-product gas formed by the reaction is removed from the resulting self-activating phosphors. The temperature of this reaction with the hydrogen, argon argon/hydrogen mixture gas can be utilized to control the amount of defects present in the oxygen and fluorine sub-lattice. Generally, the temperature of the gas will be from about 200° C. to about 1000° C., such as from about 500° C. to about 1000° C. and from about 800° C. to about 1000° C.

The time the compound is exposed to the hydrogen, argon and argon/hydrogen mixture gas can be utilized to control the amount of defects present in the oxygen and fluorine sub-lattice. Generally, using a hotter hydrogen gas requires less exposure time to achieve similar defect levels, and conversely, using a lower temperature of gas requires more exposure time to achieve similar defect levels. The flow of gas can also be regulated to control the amount of defects introduced into the ordered oxyfluoride material.

The defects occur in both the oxygen and fluorine sub-lattices of the crystalline structure and introduce two additional variables (δ1 and δ2) into the formula, producing the formula:

$$Sr_{3-x}A_xMO_{4-\delta1-w'}F_{1-\delta2-w''}N_w$$ (Formula 4)

where A is Ba, Ca, or mixtures thereof; M is Al, Ga, In, W, Mo, Bi, or mixtures thereof; 0<x≦1; δ1 and δ2 are both from about 0.01 to about 0.1; and 0≦w≦0.05 such that 0≦w'≦0.1 and 0≦w''≦0.15. The amount of defects in the oxygen and fluorine sub-lattice can be controlled as desired. In one particular embodiment, the defects in the oxygen and fluorine sub-lattice can be such both δ1 and δ2 are between about 0.05 and about 0.15. For example, the defects in the oxygen and fluorine sub-lattice can be such that δ1 and δ2 are both about 0.05.

Figure 5:
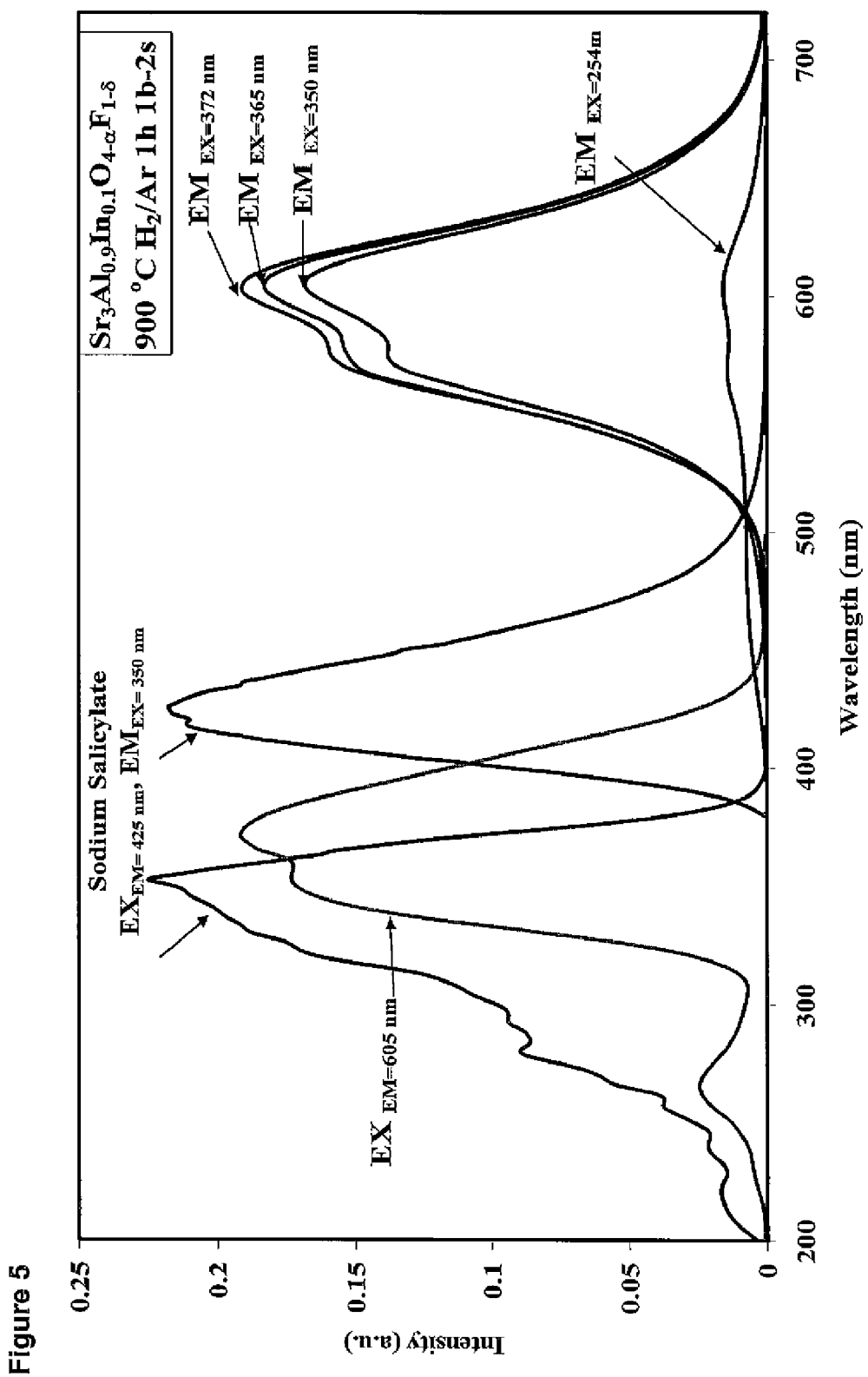
FIG. 5 shows the excitation and emission spectra of $Sr_3Al_{0.9}In_{0.1}O_{4-\delta1}F_{1-\delta2}$ compared to sodium salicylate. Estimates of the quantum efficiency indicate ~70% at wavelengths near 350 nm.

Altering the oxygen and fluorine sub-lattice of the ordered oxyfluoride compounds surprisingly creates a self-activating phosphor that can exhibit luminescence in the visual section of the spectrum of light. In particular, the wavelength of luminescence of a particular self-activating phosphor of the present invention can be controlled by altering the amount of defects in the oxygen and fluorine sub-lattice (i.e., controlling "δ1" and "δ2" in the general formula given above). (See e.g., FIG. 5). Without wishing to be bound by theory, it is believed that the defects created in this process are located in the $A_2F^{3+}$ and $AMO_4^{3-}$ layers, respectfully for the fluorine and oxygen defects, such as disclosed in U.S. patent application Ser. No. 12/348,610 filed on Jan. 5, 2009, which is incorporated by reference herein.

One particularly suitable ordered oxyfluoride compound for use as self-activating phosphors can be represented by the formula:

$$Sr_{3-x}A_xAl_{1-y}Ga_yB_zO_{4-\delta1-w'}F_{1-\delta2-w''}N_w$$ (Formula 5)

where A is Ba, Ca, or mixtures thereof; B is In, W, Mo, Bi, or mixtures thereof; 0<x≦1; 0≦y≦1; 0≦z≦0.1; δ1 and δ2 are both from about 0.01 to about 0.1; and 0≦w≦0.05 such that 0≦w'≦0.1 and 0≦w''≦0.15.

II. Doping with Activator Ions

In one embodiment, the present invention is also directed to activated compounds and their use as phosphors when doped with a variety of activator ions. Suitable activator ions can include but are not limited to rare earth elements or mixtures thereof. As used herein, the term "rare earth elements" refers to the chemical elements including the lanthanoids (the 15 elements from lanthanum to lutetium, atomic numbers 57-71) and, because of chemical similarities to the lanthanoids, the elements scandium (atomic number 21) and yttrium (atomic number 39) of group IIIb. Rare-earth elements include: scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). Other suitable activator ions can include Ac, Th, U, Cr, Mn, Tc, Re, Cu, Ag, Au, Zn, Cd, Hg, As, Sb, Bi, Ge, Sn, Pb, In, Tl, and combinations and mixtures thereof.

The ordered oxyfluoride compound according to Formula 4 doped with a rare earth element can be represented by the general formula of Formula 1 shown above:

$$A_{3-3a/2}R_aMO_{4-\delta1-w'}F_{1-\delta2-w''}N_w$$ (Formula 1)

where A is Sr alone or Sr mixed with Ba and/or Ca such that A comprises at least about ⅔ mole % of Sr and up to about ⅓ mole percent of Ba and/or Ca; R is a rare earth element or a mixture of rare earth elements; M is Al, Ga, In, W, Mo, Bi, or mixtures thereof; 0<a≦0.3; δ1 and δ2 are both from about 0.01 to about 0.1; and 0≦w≦0.05 such that 0≦w'≦0.1 and 0≦w''≦0.15.

Figure 6A:
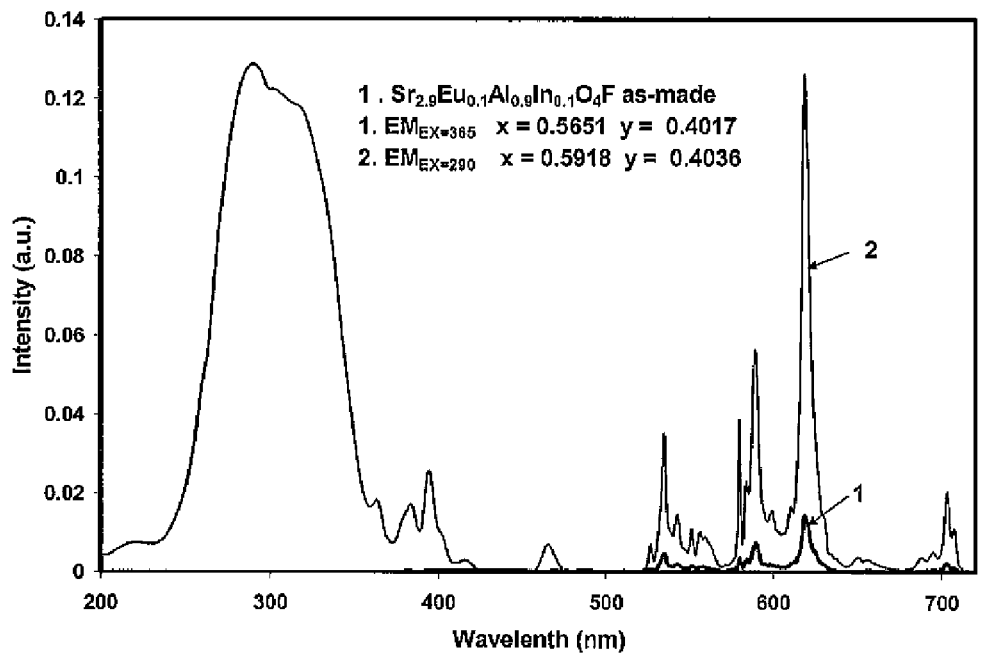
FIGS. 6(a) and 6(b) shows Eu-doped phosphors. As europium was doped in the $Sr_3Al_{0.9}In_{0.1}O_{4-\delta1}F_{1-\delta2}$ host, the emission of the phosphor turned into red from orange ($Sr_3Al_{0.9}In_{0.1}O_{4-\delta1}F_{1-\delta2}$) at 365 nm. The broader excitation band of $Sr_{2.9}Eu_{0.1}Al_{0.9}In_{0.1}O_{4-\delta1}F_{1-\delta2}$ was obtained above 300 nm compared with $Sr_{2.9}Eu_{0.1}Al_{0.9}In_{0.1}O_4F$ and $Sr_{2.9}Eu_{0.1}AlO_4F$ phosphors. Moreover, at 365 nm intense red emission with adding Eu activator in $Sr_3Al_{0.9}In_{0.1}O_{4-\delta1}F_{1-\delta2}$ system in FIG. 6(b) was provided.
Figure 6B:
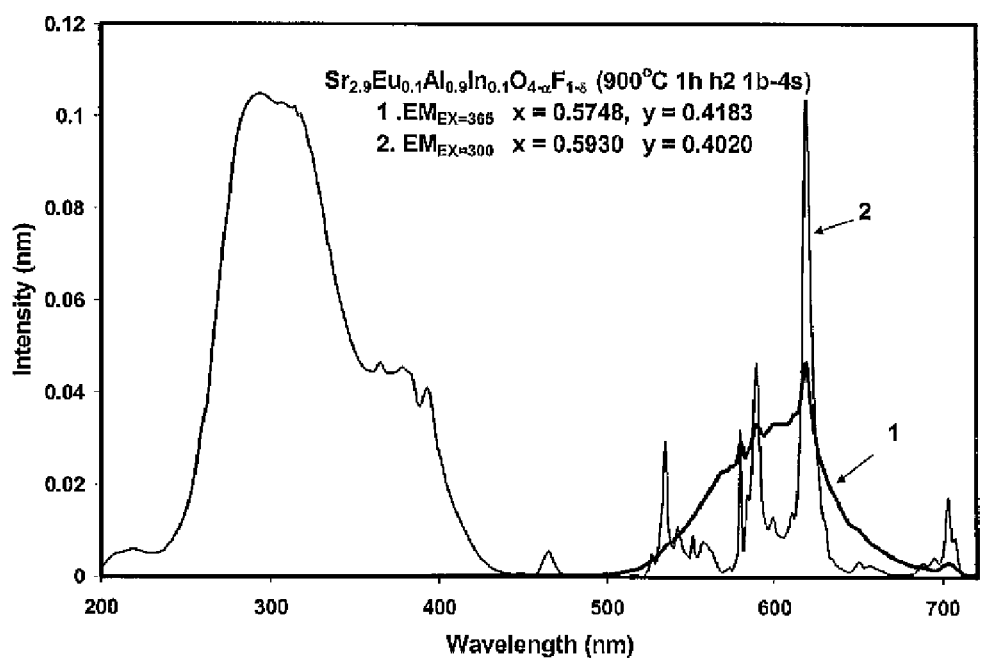

Doping with various activator ions results in the emission in the visible light when activated with UV light at either 256 and/or 366 nm. A table of representative phosphors is shown in Table 2. (See also, FIG. 6).

Phosphors for near UV AlGaN/GaN UV LEDs are generally disclosed in one embodiment. AlGaN/GaN single and multiple quantum well structures have emissions in the 360 nm region. The $A_3BO_4F$ (where A=Ca, Sr, Ba, or mixtures thereof; B=Al, Ga, In, or mixtures thereof) family of luminescent materials have resulted in a host material exhibiting self-activated emission near 600 nm when activated with 365 nm UV radiation.

According to one particular embodiment, near-UV GaN-based LEDs can be formed using host lattice materials that include indium. For example, the iridium containing ordered oxyfluoride compound can have the general formula:

$$A_{3-3a/2}R_aM_{1-c}In_cO_{4-\delta 1-w'}F_{1-\delta 2-w''}N_w \quad \text{(Formula 6)}$$

where A is Sr alone or Sr mixed with Ba and/or Ca such that A comprises at least about ⅔ mole % of Sr and up to about ⅓ mole percent of Ba and/or Ca; R is a rare earth element or a mixture of rare earth elements (e.g., a mixture of cerium and gadolinium); M is Al, Ga, W, Mo, Bi, or mixtures thereof; $0 < a \leq 0.3$, $0 < c \leq 0.2$; δ1 and δ2 are both from about 0.01 to about 0.1; and $0 \leq w \leq 0.05$ such that $0 \leq w' \leq 0.1$ and $0 \leq w'' \leq 0.15$. In one embodiment, M can represent Al, Ga, or a mixture thereof from about 90 mole % to about 100 mole % combined with from about 0 mole % to about 10 mole % of W, Mo, Bi, or a mixture thereof. These host lattice materials reveal self-activating luminescence when activated at 365 nm facilitated by broad charge-transfer absorption bands in the near UV due to the oxygen-metal charge transfer. This system reveals a tunability of the excitation bands due to the variety of $MO_4$ tetrahedra that can be accommodated in this structure type. This structure type also allows for fine tuning of CIE values by controlling the defect chemistry in the $AMO_4^{3-}$ and $A_2F^{3+}$ layers respectively, where A represents Sr, Ba, Al, In, or mixtures thereof.

Furthermore, the doping of an activator ion (e.g., $Eu^{3+}$) into this structure can allow a non-radiative transfer of the UV energy absorbed in the charge-transfer bands in the near UV and enhance the red color. (See e.g., FIG. 6).

Thus, the self-activating phosphors can be configured to absorb, with high efficiency near-ultraviolet (UV) light (e.g., 360 nm) emitted by a light source, such as an LED or laser diode, and emit light of a wavelength longer than that of the absorbed light. Thus, in one embodiment, the self-activating phosphors can absorb near-UV light and emit visible light. The self-activating phosphors can be configured to emit broad color spectra that can be tuned from blue to green to yellow and red emissions.

III. Light Emitting Devices

The presently disclosed self-activating phosphors can be included in light emitting devices, such as fluorescent bulbs and tubes, light emitting diodes (LEDs), liquid crystal display (LCD) panels, etc. The self-activating phosphors of the present disclosure can be utilized in the same manner as other known phosphors in these devices.

For example, the light emitting device can include a discharge lamp (e.g., a Hg plasma lamp) that generates UV light at about 254 nm and at about 360 nm to excite the composition, such that the composition produces an emission in the visible light spectrum (e.g., wavelengths from about 380 to about 750 nm).

The self-activating phosphors can be configured to absorb, with high efficiency ultraviolet (UV) light (e.g., 254 nm) and/or the near-UV light (e.g., from about 350 nm to about 400 nm, such as about 260 nm) emitted by a light source, such as an LED or laser diode, and emit light of a wavelength longer than that of the absorbed light. Thus, in one embodiment, the self-activating phosphors can absorb UV light and/or near-UV light and emit visible light. The self-activating phosphors can be configured to emit broad color spectra that can be tuned from blue to green to yellow and red emissions.

In one particular embodiment, the presently disclosed phosphors can be used to make white-light emitting devices by exposing an appropriate mixture of a red, green and blue phosphor to light from a light emitting device (LED) in the UV range of the spectrum (UV-LED). An example device uses an InGaN chip emitting an emission band at 395 nm.

Matching the luminescent efficiencies and absorption peaks of these phosphors can obtain white-light emitting diodes for use, for instance, in the backlight of liquid crystal displays, automobile lights and solid state lights, due to a high efficiency and lower energy consumption, good reliability and long lifetime.

EXAMPLES

Samples of $(A1/A2)_{3-3a/2}RE_aMO_4F$, where RE=Eu, Tb, Er, Tm; A(1)/A(2)=Sr, Ca, Ba; and M=Al, Ga, were prepared by heating the appropriate stoichiometric amounts of $SrCO_3$ (Alfa 99%), $CaCO_3$ (Alfa 99%), $BaCO_3$ (Alfa 99.8%), $SrF_2$ (Alfa 99%), $Al_2O_3$ (Alfa 99.95%), $Ga_2O_3$ (Alfa 99.99%), $Eu_2O_3$ (Alfa 99.9%), $Tm_2O_3$ (Alfa 99.9%), $Er_2O_3$ (Alfa 99.9%), and $Tb_4O_7$ (Alfa 99.9%) under 4% $H_2$/Ar. The luminescent materials formed after initial heating at 900° C. for 3 h. After further grinding, the samples were annealed at 1000° C. for 3 h and finally re-heated to 1050° C. for 3 h. Phase identification was established using a MiniFlex™ (Rigaku) diffractometer (Cu Kα radiation) and the unit cell parameters were determined by using the least squares refinement program CELREF. Ultraviolet-visible spectroscopy to measure the excitation and emission spectra of the $(A1/A2)_{3-3a/2}RE_aMO_4F$ materials was done using a spectrofluorometer (Fluorat-02-Panorama).

Figure 2:
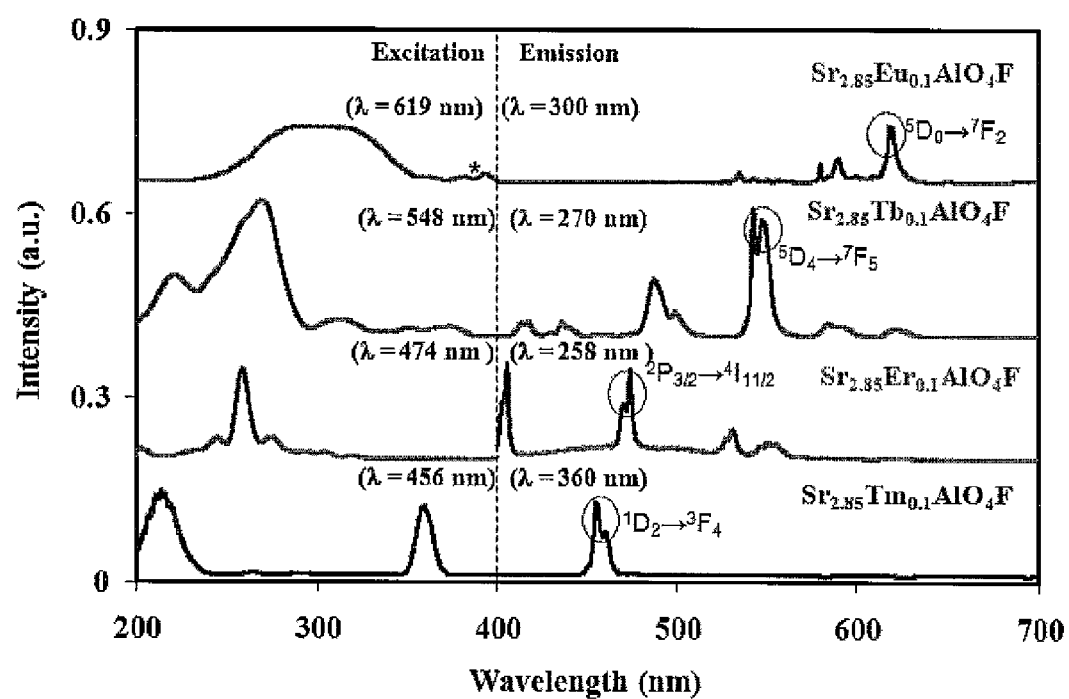
FIG. 2 shows the red, green, blue-greenish, and blue photoluminescence spectra of $Sr_{2.85}RE_{0.1}AlO_4F$ for $RE^{3+}$=Eu, Tb, Er and Tm. The charge-balanced stoichiometries are $Sr_{2.85}Eu_{0.1}GaO_4F$, $Sr_{2.85}Tb_{0.1}GaO_4F$, $Sr_{2.85}Er_{0.1}GaO_4F$, and $Sr_{2.85}Tm_{0.1}GaO_4F$.

FIG. 2 shows the red, green, blue-greenish, and blue photoluminescence spectra of $Sr_{2.85}RE_{0.1}AlO_4F$ for $RE^{3+}$=Eu, Tb, Er and Tm. Distinct peaks in the emission spectra of $Sr_{2.85}RE_{0.1}AlO_4F$ represent the major electronic transitions between 400-700 nm. The excitation spectrum of $Sr_{2.85}Eu_{0.1}AlO_4F$ can be divided into two regions: the first region reveals a broad excitation band at lower wavelengths centered around 300 nm which is caused by $O^{2-}$-$Eu^{3+}$ charge-transfer. Charge-transfer transitions take place between the oxygen and fluorine ligands and the earth activators. These are strong absorption processes with no selection rules. S. Fujihara et. al have reported on the excitation bands for the $O^{2-}$-$Eu^{3+}$ and $F^-$-$Eu^{3+}$ charge-transfers in $La_{1-x}Eu_xOF$ and $La_{1-x}Eu_xF_3$, respectively.[i] The $F^-$-$Eu^{3+}$ charge-transfer at shorter wavelengths was barely observable in the excitation spectrum of $La_{1-x}Eu_xF_3$ because more energy is required to excite an electron in a $F^-$ containing lattice than an $O^{2-}$ containing one. In contrast in $La_{1-x}Eu_xOF$ a broad excitation band around 272 nm was assigned to the $O^{2-}$-$Eu^{3+}$ charge transfer. Similar to what was observed in the excitation spectra of $La_{1-x}Eu_xOF$, the excitation of $Sr_{2.85}Eu_{0.1}AlO_4F$ using a wavelength of 619 nm ($^5D_0 \rightarrow {}^7F_2$ transition of $Eu^{3+}$) results in an intense and broad $O^{2-}$-$Eu^{3+}$ charge-transfer band at about 300 nm as well as low intensity f-f transitions (asterisk mark in FIG. 2) just below 400 nm[ii]. A band originating from the $F^-$-$Eu^{3+}$ charge-transfer in the excitation spectra is not observed as shown in FIG. 2. The major red emission peak of $Sr_{2.85}Eu_{0.1}AlO_4F$ corresponds to the $^5D_0 \rightarrow {}^7F_2$ transition of $Eu^{3+}$ located at 619 nm together with some week peaks assigned to the $^5D_1 \rightarrow {}^7F_2$, $^5D_0 \rightarrow {}^7F_0$, $^5D_1 \rightarrow {}^7F_3$, $^5D_0 \rightarrow {}^7F_1$ in the range of 500 to 600 nm.

We observe a strong bright green emission when exciting $Sr_{2.85}Tb_{0.1}AlO_4F$ with UV light of 270 nm. The major green emission peaks of $Sr_{2.85}Tb_{0.1}AlO_4F$ in the range between 400-700 nm are at 548 nm and 490 nm, which are assigned to the $^5D_4 \rightarrow {}^7F_5$ and $^5D_4 \rightarrow {}^7F_6$, respectively. The other transitions observed are $^5D_3 \rightarrow {}^7F_5$ and $^5D_3 \rightarrow {}^7F_4$ blow 450 nm and $^5D_4 \rightarrow {}^7F_4$ and $^5D_4 \rightarrow {}^7F_3$ above 550 nm. Similar to the excitation spectra of $Tb^{3+}$ doped $SrAl_2O_4$ and many other $Tb^{3+}$- doped materials,[iii,iv] we also observe the strong excitation peaks in the $Sr_{2.85}Tb_{0.1}AlO_4F$ spectra near 230 nm, which are assigned to spin-forbidden 4f-5d transitions of the $Tb^{3+}$. Weak excitation peaks in the 300-400 nm range are assigned to f-f transitions of $Tb^{3+}$ (see FIG. 2).

The peaks of the blue-green emission spectra of $Sr_{2.85}Er_{0.1}AlO_4F$ are assigned to the $^2P_{3/2} \rightarrow {}^4I_{13/2}$, $^2P_{3/2} \rightarrow {}^4I_{11/2}$, $^2H_{11/2} \rightarrow {}^4I_{15/2}$, and $^4S_{3/2} \rightarrow {}^4I_{15/2}$ transitions in order of increasing wavelength. In the emission spectra of $Sr_{2.85}Er_{0.1}AlO_4F$ a relatively broad but weak band is observed between wavelengths of 400 and 550 nm. The strong emission peaks in the green region (500-600 nm) originating from the 4f-inner shell transitions of $Er^{3+}$ in Er-doped $Sr_3AlO_4F$ are similar to the emission peaks found in Er-doped GaN spectra[v]. In the blue region (400-500 nm) the strong peaks correspond to $^2P_{3/2} \rightarrow {}^4I_{13/2}$ and $^2P_{3/2} \rightarrow {}^4I_{11/2}$ transitions and were assigned in analogy to those observed in the emission spectra of Er-doped AlN by A. Wakahara et. al at 408 and 479 nm, respectively.[vi] Furthermore, similar to what was observed in the emission spectra of Er-doped AlN, the emission spectra of $Sr_{2.85}Er_{0.1}AlO_4F$ reveals weak emission peaks in the green region at 530 and 550 nm, while the strong emission peaks in the blue region are at 405 and 474 nm.

Figure 3:
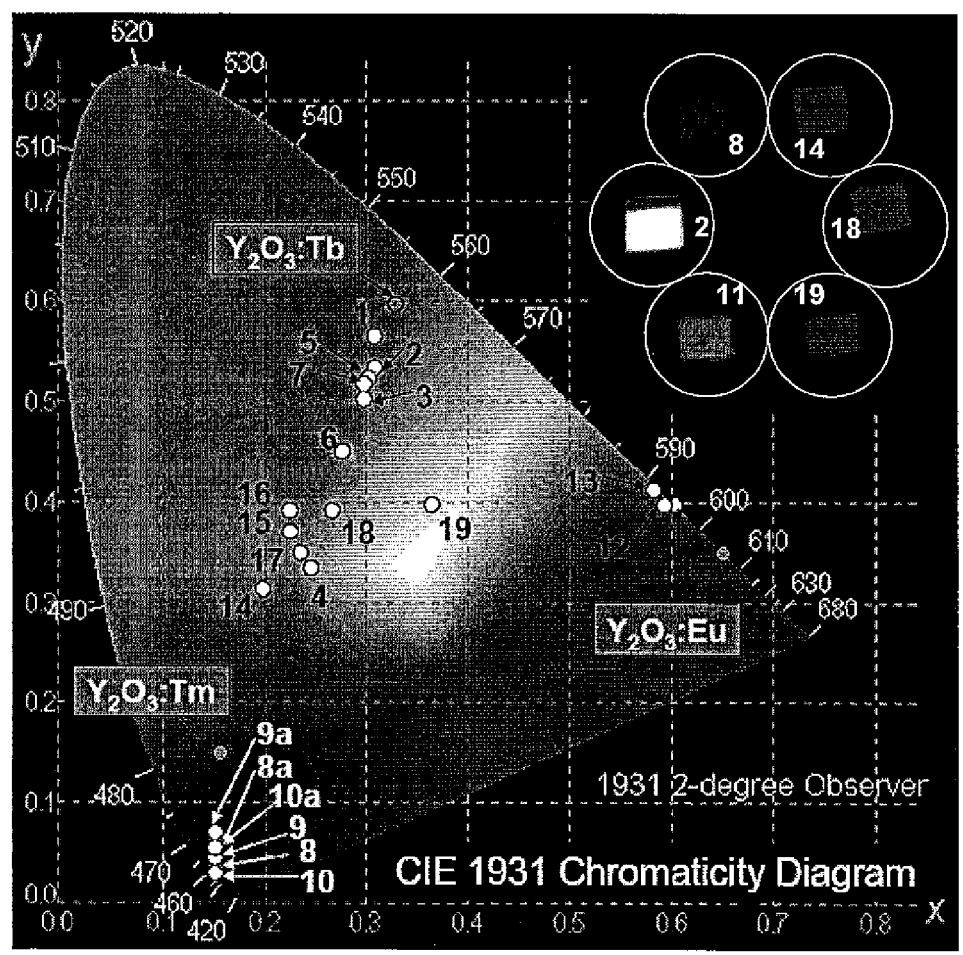
FIGS. 3 and 4 show the fluorescence of some new phosphors and the corresponding chromaticity Commission International de l'Eclairage (CIE) coordinates as discussed in the Examples.

The luminescent spectrum of $Sr_{2.85}Tm_{0.1}AlO_4F$ reveals that this material emits in the blue region. The strong emission peak at around 456 nm is assigned to the $^1D_2 \rightarrow {}^3F_4$ transition of $Tm^{3+}$. In the excitation spectra of $Sr_{2.85}Tm_{0.1}AlO_4F$, there are two peaks at 360 and 215 nm. The first transition is assigned to the transition from the $^3H_6$ ground-state to the $^1D_2$ excited state (~360 nm).[vii] However, the energy of the strong band at ~215 nm is higher than its $^3P_2$ level at 38193 cm$^{-1}$, ~262 nm and much lower than its $^1S_0$ level at 79592 cm$^{-1}$, ~126 nm.[viii] The peak centered at 215 nm was found to be due to absorption of the $Sr_3AlO_4F$ host lattice. The chromaticity coordinates x and y in accordance with the Commission International de l'Eclairage (1931 CIE) of some of the new phosphors in the $(A1/A2)_{3-3a/2}RE_aMO_4F$ family (RE=Eu, Tb, Er, Tm, A(1)/A(2)=Sr, Ca, Ba, M=Al, Ga) and the Eu, Tb, Tm-doped $Y_2O_3$ RGB (red-green-blue) phosphor triplets[ix] are shown in FIG. 3. The CIE calorimetric system, which is used to describe the color of a light source, was established by the CIE in 1931.[x] Three color-matching functions are used to obtain the tristimulus values (XYZ) from which the chromaticity coordinates x=X/(X+Y+Z) and y=Y/(X+Y+Z) can be obtained. The chromaticity diagram is a 2D-plot of all possible hue and saturation values of the investigated light source. The chromaticities of monochromatic spectral colors are located at the perimeter. The CIE values are summarized in Table 1. All numbers (1-19) in FIG. 3 correspond to the numbers representing luminescence materials listed in Table 1:

TABLE 1

| Luminescence Materials | CIE values | |
|---|---|---|
| | x | y |
| Green | | |
| 1. $Sr_{2.55}Tb_{0.3}AlO_4F$ (Ex = 270 nm) | 0.3141 | 0.5638 |
| 2. $Sr_{2.85}Tb_{0.1}AlO_4F$ (Ex = 270 nm) | 0.3051 | 0.5295 |
| 3. $Sr_{2.925}Tb_{0.05}AlO_4F$ (Ex = 270 nm) | 0.2927 | 0.5015 |
| 4. $Sr_{2.985}Tb_{0.01}AlO_4F$ (Ex = 270 nm) | 0.2391 | 0.3303 |
| 5. $Sr_{2.4}Ca_{0.45}Tb_{0.1}AlO_4F$ (Ex = 270 nm) | 0.3015 | 0.5205 |
| 6. $Sr_{2.4}Ba_{0.45}Tb_{0.1}AlO_4F$ (Ex = 260 nm) | 0.2702 | 0.4435 |
| 7. $Sr_{2.85}Tb_{0.1}Ga_{0.5}Al_{0.5}O_4F$ (Ex = 265 nm) | 0.2993 | 0.5178 |

TABLE 1-continued

| Luminescence Materials | CIE values | |
|---|---|---|
| | x | y |
| Blue | | |
| 8. $Sr_{2.85}Tm_{0.1}AlO_4F$ (Ex = 360 nm) | 0.1478 | 0.0340 |
| 8a. (Ex = 215 nm) | 0.1496 | 0.0625 |
| 9. $Sr_{2.4}Ca_{0.45}Tm_{0.1}AlO_4F$ (Ex = 360 nm) | 0.1472 | 0.0403 |
| 9a. (Ex = 215 nm) | 0.1407 | 0.0714 |
| 10. $Sr_{2.4}Ba_{0.45}Tm_{0.1}AlO_4F$ (Ex = 360 nm) | 0.1478 | 0.0335 |
| 10a. (Ex = 218 nm) | 0.1484 | 0.0584 |
| Red | | |
| 11. $Sr_{2.85}Eu_{0.1}AlO_4F$ (Ex = 300 nm) | 0.6087 | 0.3869 |
| 12. $Sr_{2.4}Ca_{0.45}Eu_{0.1}AlO_4F$ (Ex = 285 nm) | 0.5913 | 0.4023 |
| 13. $Sr_{2.4}Ba_{0.45}Eu_{0.1}AlO_4F$ (Ex = 300 nm) | 0.5791 | 0.4152 |
| Blue-Green | | |
| 14. $Sr_{2.85}Er_{0.1}AlO_4F$ (Ex = 258 nm) | 0.1959 | 0.3119 |
| 15. $Sr_{2.985}Er_{0.01}AlO_4F$ (Ex = 258 nm) | 0.2203 | 0.3690 |
| 16. $Sr_{2.4}Ca_{0.45}Er_{0.1}AlO_4F$ (Ex = 258 nm) | 0.2238 | 0.3931 |
| 17. $Sr_{2.4}Ba_{0.45}Er_{0.1}AlO_4F$ (Ex = 258 nm) | 0.2297 | 0.3500 |
| White | | |
| 18. $Sr_{2.85}Er_{0.099}Eu_{0.001}AlO_4F$ (Ex = 258 nm) | 0.2640 | 0.3887 |
| 19. $Sr_{2.85}Er_{0.095}Eu_{0.005}AlO_4F$ (Ex = 258 nm) | 0.3561 | 0.4036 |

In so far as the rare-earth doped in single $Y_2O_3$ host shows RGB (red-green-blue) phosphor triplets, it is worth to compare their CIE values with those of the rare-earth doped members in new oxyfluorides host. The CIE coordinates of the Tb-doped green phosphor of $Sr_{2.55}Tb_{0.3}AlO_4F$ (1) and $Sr_{2.85}Tb_{0.1}AlO_4F$ (2) are close to the ones of Tb-doped $Y_2O_3$. However, the CIE coordinates of $Sr_{2.99}Tb_{0.01}AlO_4F$ (4) are very different from two distinct green phosphors $Sr_{2.55}Tb_{0.3}AlO_4F$ and $Sr_{2.85}Tb_{0.1}AlO_4F$ with higher concentrations of $Tb^{3+}$ due to its low intensity in the green emission region. When $Sr^{2+}$ in $Sr_{2.85}Tb_{0.1}AlO_4F$ is replaced by $Ba^{2+}$ (5, 6) the CIE coordinates of $Sr_{2.4}Ba_{0.45}Tb_{0.1}AlO_4F$ are shifted to the blue region. When $Sr^{2+}$ in $Sr_{2.85}Tb_{0.1}AlO_4F$ is replaced by $Ca^{2+}$, the new blue phosphor $(Sr_{2.4}Ca_{0.45})Tm_{0.1}AlO_4F$ (9a, ex=215 nm) has comparable CIE coordinates to the ones of Tm-doped $Y_2O_3$. When substituting $Sr^{2+}$ in $Sr_{2.85}Tb_{0.1}AlO_4F$ by $Ca^{2+}$ or $Ba^{2+}$ (12, 13) (11), the CIE coordinates shift towards orange.

The coordinates of the Er and Eu-substituted phosphors are in the blue-green and red regions, respectively. Also investigated were the Er and Eu co-doping of the oxyflouride lattice in an attempt to combine the blue-green and red emissions of Er and Eu respectively to create near white-light emission. White light CIE coordinates are ideally located in the center of the chromaticity diagram (0.35, 0.35). The emission of the blue-green Er-doped phosphor (14) can be shifted towards white light emissions by co-doping with Eu. This leads to white-green (18, $Sr_{2.85}Er_{0.099}Eu_{0.001}AlO_4F$) and white-red (19, $Sr_{2.85}Er_{0.095}Eu_{0.005}AlO_4F$) emission. FIG. 3b shows the photos of green $Sr_{2.85}Tb_{0.1}AlO_4F$ (2), blue $Sr_{2.85}Tm_{0.1}AlO_4F$ (8), red $Sr_{2.85}Eu_{0.1}AlO_4F$ (11), blue-green $Sr_{2.85}Er_{0.1}AlO_4F$ (14), white-green $Sr_{2.85}Er_{0.0099}Eu_{0.001}AlO_4F$ (18), and white-red $Sr_{2.85}Er_{0.095}Eu_{0.005}AlO_4F$ (19) under a 254 nm UV lamp.

The synthesis of the solid solutions $Sr_{3-x}A_xAlO_4F$ (A=Ba, Ca) has been previously established and compositions with x>1 have been shown to no longer be single phases.

Figure 4A:
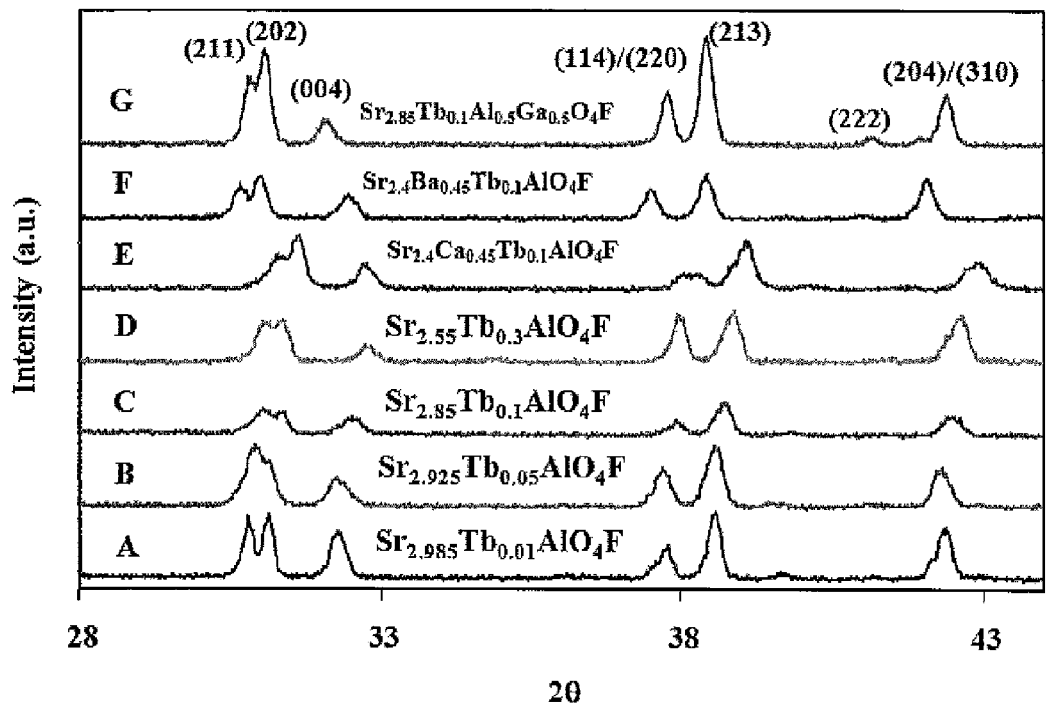

All diffraction patterns of materials in the $(A1/A2)_{3-3a/2}RE_aMO_4F$ family (RE=Eu, Tb, Er, Tm, A(1)/A(2)=Sr, Ba, Ca, M=Al, Ga) in FIG. 4a can be indexed using a tetragonal unit cell with space group I4/mcm. There is a gradual shift in the positions of the various Bragg reflections to higher or lower angles upon addition of the smaller Tb and Ca (A~E) and larger Ba and Ga (F, G) ions, respectively. The lattice parameters of the various oxyfluoride phosphors are listed in Table 2:

TABLE 2

| | | Unit Cell | | |
|---|---|---|---|---|
| | Compounds | a (Å) | c (Å) | Volume (Å$^3$) |
| A | $Sr_{2.985}Tb_{0.01}AlO_4F$ | 6.749 (17) | 11.113 (2) | 506.2 (13) |
| B | $Sr_{2.925}Tb_{0.05}AlO_4F$ | 6.751 (12) | 11.083 (2) | 505.2 (9) |
| C | $Sr_{2.85}Tb_{0.1}AlO_4F$ | 6.739 (18) | 10.991 (9) | 499.2 (14) |
| D | $Sr_{2.55}Tb_{0.3}AlO_4F$ | 6.727 (12) | 10.949 (2) | 495.4 (9) |
| E | $Sr_{2.4}Ca_{0.45}Tb_{0.1}AlO_4F$ | 6.707 (14) | 10.880 (3) | 489.5 (11) |
| F | $Sr_{2.4}Ba_{0.45}Tb_{0.1}AlO_4F$ | 6.793 (15) | 11.103 (3) | 512.3 (11) |
| G | $Sr_{2.85}Tb_{0.1}Al_{0.5}Ga_{0.5}O_4F$ | 6.765 (13) | 11.153 (8) | 510.5 (10) |

Figure 4B:
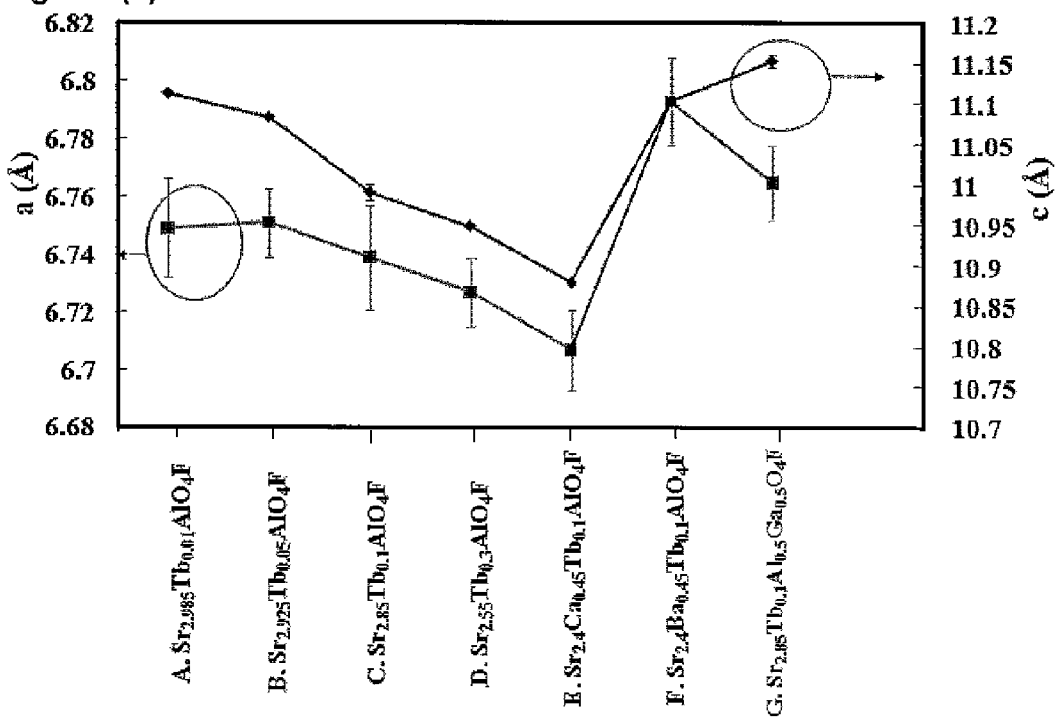
Figure 4C:
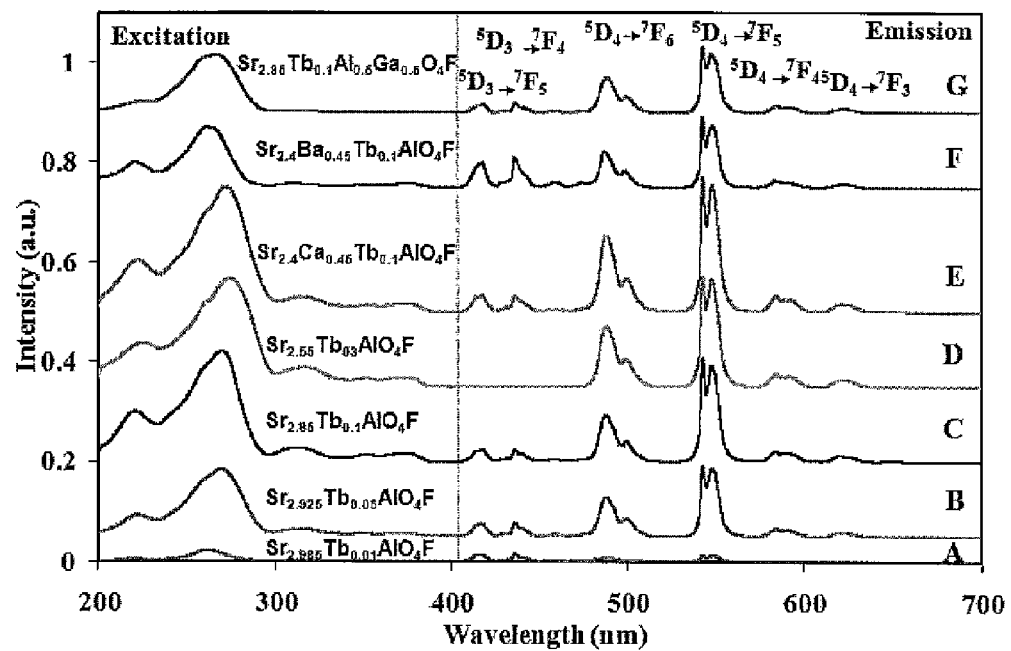
Figure 4D:
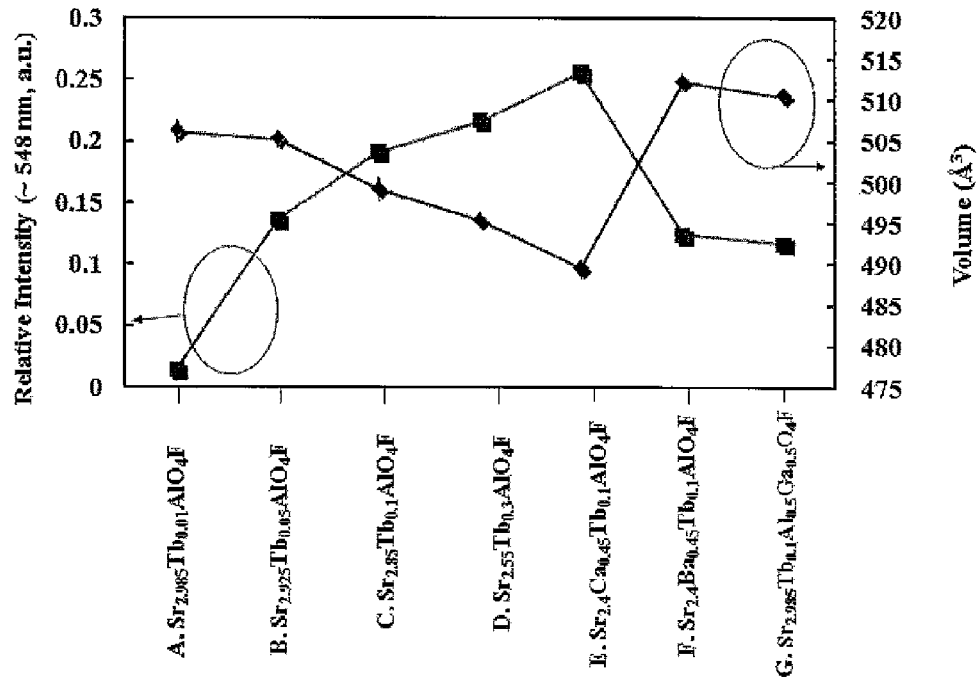

Both the a and c unit cell parameters show a correlation with the Tb-content in the series $Sr_{3-3a/2}Tb_aAlO_4F$ (A~D). The a and c lattice parameters of $Sr_{2.85}Tb_{0.1}AlO_4F$ (C) are increased when substituting Sr with Ba (F) and Al by Ga (G) ions and decreased by substituting Sr by Ca (E). FIG. 4b shows the plot of a and c lattice parameters of $Sr_{3-3a/2}Tb_aAlO4F$ (a<0.3), $(Sr_{2.4}Ca_{0.45})Tb_{0.1}AlO_4F$ or $(Sr_{2.4}Ba_{0.45})Tb_{0.1}AlO_4F$ and $Sr_{2.85}Tb_{0.1}Al_{0.5}Ga_{0.5}O_4F$. The radius of the $Tb^{3+}$ ion (1.04 Å for CN 8) is smaller than $Ca^{2+}$ (1.12 Å for CN 8, 1.23 Å for CN 10), $Sr^{2+}$ (1.26 Å for CN 8, 1.36 Å for CN 10), and $Ba^{2+}$ (1.42 Å for CN 8, 1.52 Å for CN 10).$^{xi}$ As expected, when doped with $Tb^{3+}$ ions, the lattice parameters decrease. Both A(1) and A(2) sites will have quite large local distortions in the $Sr_{3-3a/2}Tb_aAlO_4F$ (a~0.3) host due to the smaller $Tb^{3+}$ ionic radius compared to the one of $Sr^{2+}$ ions. Since smaller $Ca^{2+}$ ions (r=1.12 Å) prefer the A(2) site, we propose that $Tb^{3+}$ ions (r=1.04 Å) will also occupy the A(2) site, which is normally 8 coordinated. Furthermore, as discussed above the A(2) site is substantially under bonded as its valence sum of 1.30 indicates and will therefore be quite accommodating for $Tb^{3+}$ ions. The Tb mole fraction-dependent PL spectra of $Sr_{3-3a/2}Tb_aAlO_4F$ (a ~0.3) host materials are shown in FIG. 4c. The PL intensity dramatically increased with increasing Tb concentrations from a=0.01 to 0.05 in $Sr_{3-3a/2}Tb_aAlO_4F$. Concentration dependent quenching manifested by the decrease of the emission intensity is caused primarily by the dipole-dipole interaction between rare-earth ions. This behavior is not observed up to a ~0.3 in $Sr_{3-3a/2}Tb_aAlO_4F$ phosphors which is the limit of the solid solubility as indicated by the appearance of an impurity phase of $Tb_2O_3$ in X-ray powder diffraction pattern. In the excitation spectra of $Sr_{2.85}Tb_{0.1}AlO_4F$ (C), $(Sr_{2.4}Ca_{0.45})Tb_{0.1}AlO_4F$ (E) or $(Sr_{2.4}Ba_{0.45})Tb_{0.1}AlO_4F$ (F) as the $Sr^{2+}$ is replaced by $Ca^{2+}$ or $Ba^{2+}$, the excitation band moves towards high and low wavelengths, respectively. The relative intensities of the emissions in the green wavelength range in $Sr_{3-3a/2}Tb_aAlO_4F$ phosphors are enhanced with increasing concentrations of $Tb^{3+}$ ions. Substituting $Sr^{2+}$ by $Ca^{2+}$ and $Ba^{2+}$ in $Sr_{2.85}Tb_{0.1}AlO_4F$ results in a lattice contraction and expansion respectively shown in FIG. 4b and Table 2. In FIG. 4c the relative intensities above 480 nm, which dominate the green emission, increase for $(Sr_{2.4}Ca_{0.45})Tb_{0.1}AlO_4F$ (E) and significantly decrease for $(Sr_{2.4}Ba_{0.45})Tb_{0.1}AlO_4F$ (F) compared to the relative intensity of $Sr_{2.85}Tb_{0.1}AlO_4F$.$^{xii}$ The relatively strong peaks in the blue region of the emission spectra of $(Sr_{2.4}Ba_{0.45})Tb_{0.1}AlO_4F$ (F) below 480 nm are found at around 420 and 440 nm ($^5D_3 \to {}^7F_5$ and $^5D_3 \to {}^7F_4$) respectively. Due to the relatively strong emission peaks in the blue region of the emission spectrum of $(Sr_{2.4}Ba_{0.45})Tb_{0.1}AlO_4F$ (F) emission, the CIE coordinates are shifted to the blue color region (FIG. 3) when $Sr^{2+}$ in $Sr_{2.85}Tb_{0.1}AlO_4F$ is replaced by $Ba^{2+}$. The relative intensities of the PL can thus be easily varied by appropriate cation substitution. The contraction of the unit cell induces a larger crystal field splitting resulting in a stronger PL$^{xiii,xiv}$. The green emissions of the $Sr_{3-3a/2}Tb_aAlO_4F$ and $(Sr_{2.4}Ca_{0.45})Tb_{0.1}AlO_4F$ (E) phosphors where the relative intensities of the major peaks are centered near 548 nm and correspond to the $^5D_4 \to {}^7F_5$ transition are increased by the contraction of the unit cell as shown in FIG. 4d. On the other hand, the relative intensity of the emission spectra of $(Sr_{2.4}Ba_{0.45})Tb_{0.1}AlO_4F$ (F) is dramatically decreased when expanding the unit cell volume. When half of the $AlO_4$ tetrahedra are substituted by $GaO_4$ tetrahedra in the $Sr_{2.85}Tb_{0.1}AlO_4F$ phosphor, the cell volume is increased as a result of the substitution of the smaller $Al^{3+}$ (0.39 Å for 4CN) by the larger $Ga^{3+}$ (0.47 Å for 4CN), while the relative emission intensity at 548 nm on the emission spectra of $Sr_{2.85}Tb_{0.1}AlO_{0.5}Ga_{0.5}O_4F$ is reduced in comparison to the emission intensity of $Sr_{2.85}Tb_{0.1}AlO_4F$ as shown in FIG. 4d.

Thus, a new family of phosphors based on $Sr_{3-x}A_xMO_4F$ host lattices (A=Ca, Ba), which show line emission luminescence in the visible region of the electromagnetic spectrum when various rare activators are substituted into them. The various chemical substitutions this host lattice is amenable to allows tailoring of the CIE values to desired values. In the Tb-substituted green phosphor $Sr_{3-3a/2}Tb_aAlO4F$ system no luminescence quenching was observed up to the solubility limit of a ~0.3. The Tm-substituted system can be activated using light with a 360 nm wavelength accessible with near UV-InGaN light emitting devices.

These and other modifications and variations to the present invention may be practiced by those of ordinary skill in the art, without departing from the spirit and scope of the present invention, which is more particularly set forth in the appended claims. In addition, it should be understood the aspects of the various embodiments may be interchanged both in whole or in part. Furthermore, those of ordinary skill in the art will appreciate that the foregoing description is by way of example only, and is not intended to limit the invention so further described in the appended claims.

[$^I$] S. Fujihara, T. Kato, T. Kimura, J. Sol-Gel Sci. Tech. 26 (2003) 953.

[$^{II}$] X. Xiao, B. Yan, Mater. Lett. 61 (2007) 1649.

[$^{III}$] Z. Fu, S. Zhou, S. Zhang, J. Phys. Chem. B 109 (2005) 14396.

[$^{IV}$] X. Bai, G. Zhang, P. Fu, J. Solid State Chem. 180 (2007) 1972.

[$^V$] D. S. Lee, A. J. Stecki, Appl. Phys. Lett. 2001, 79, 1962.

[$^{VI}$] A. Wakahara, Y. Nakanishi, T. Fujiwara, H. Okada, A. Yoshida, T. Ohshima, T. Kamiya, Y. T. Kim, Phys. Stat. Sol. (a) 12 (2004) 2768.

[$^{VII}$] F. S. Liu, B. J. Sun, J. K. Liang, Q. L. Liu, J. Luo, Y. Zhang, L. X. Wang, J. N. Yao, G. H. Rao, J. Solid State Chem. 178 (2005) 1064.

[$^{VIII}$] W. T. Carnall, P. R. Fields, K. Rajnak, J. Chem. Phys. 49(10) (1968) 4424.

[$^{IX}$] J. Hao, S. A. Studenikin, M. Cocivera, J. Lumin. 93 (2001) 313.

[$^X$] W. M. Yen, S. Shionoya, H. Yamamoto, Phosphor Handbook 2nd Ed. CRC Press, p 801, 805, 831.

[$^{XI}$] R. D. Shannon, Acta Cryst. A32 (1976) 751.

[$^{XII}$] Z. Lou, J. Hao, M. Cocivera, J. Phys D: Appl. Phys. 35 (2002) 2841.

[XIII] F. C. Palilla, A. K. Levine, M. R. Tomkus, J. Electrochem. Soc. 115 (1968) 642.

[IX] Y. Q. Li, G. de With, H. T. Hintzen, J. Electrochem. Soc. 153 (2006) G278.

What is claimed:

1. A light emitting device comprising
a light producing element configured to generate ultraviolet light having a wavelength of from about 250 nm to about 400 nm; and
a self-activating phosphor comprising an ordered nitrogen-containing or nitrogen-free oxyfluoride compound having a formula:

$$A_{3-3a/2}R_a MO_{4-\delta1-w'}F_{1-\delta2-w''}N_w$$

where A is Sr alone or Sr mixed with Ba and/or Ca such that A comprises at least about ⅔ mole % of Sr and up to about ⅓ mole percent of Ba and/or Ca; R is a rare earth element or a mixture of rare earth elements; M is Al, Ga, In, W, Mo, Bi, or mixtures thereof; $0<a<0.3$; $\delta1$ and $\delta2$ are both from about 0.01 to about 0.1; and $0\leq w \leq 0.05$ such that $0\leq w' \leq 0.1$ and $0\leq w'' \leq 0.15$; wherein the ultraviolet light excites the self-activating phosphor such that the self-activating phosphor emits visible light having a wavelength of from about 380 to about 750 nm.

2. The light emitting device as in claim 1, wherein $\delta1$ and $\delta2$ are both about 0.05.

3. The light emitting device as in claim 1, wherein the ultraviolet light that excites the self-activating phosphor has a wavelength of from about 350 nm to about 400 nm.

4. The light emitting device as in claim 1, wherein the ultraviolet light that excites the self-activating phosphor has a wavelength of about 260 nm.

5. The light emitting device as in claim 1, wherein the light producing element comprises a Hg plasma lamp.

6. The light emitting device as in claim 1, wherein the rare earth element comprises europium.

7. The light emitting device as in claim 1, wherein M represents Al, Ga, or a mixture thereof from about 90 mole % to about 100 mole % combined with from about 0 mole % to about 10 mole % of In, W, Mo, Bi, or a mixture thereof.

8. The light emitting device as in claim 1, wherein R comprises a mixture of cerium and gadolinium.

9. A light emitting device comprising
a light producing element configured to generate ultraviolet light having a wavelength of from about 250 nm to about 400 nm; and
a self-activating phosphor comprising an ordered nitrogen-free or nitrogen-containing oxyfluoride compound having a formula:

$$A_{3-3a/2}R_a M_{1-c}In_c O_{4-\delta1-w'}F_{1-\delta2-w''}N_w$$

where A is Sr alone or Sr mixed with Ba and/or Ca such that A comprises at least about ⅔ mole % of Sr and up to about ⅓ mole percent of Ba and/or Ca; R is a rare earth element or a mixture of rare earth elements; M is Al, Ga, W, Mo, Bi, or mixtures thereof; $0<a\leq 0.3$; $0<c\leq 0.2$; $\delta1$ and $\delta2$ are both from about 0.01 to about 0.1; and $0\leq w \leq 0.05$ such that $0\leq w' \leq 0.1$ and $0\leq w'' \leq 0.15$, wherein the ultraviolet light excites the self-activating phosphor such that the self-activating phosphor emits visible light having a wavelength of from about 380 to about 750 nm.

10. The light emitting device as in claim 9, wherein $\delta1$ and $\delta2$ are both about 0.05.

11. The light emitting device as in claim 9, wherein the ultraviolet light that excites the self-activating phosphor has a wavelength of from about 350 nm to about 400 nm.

12. The light emitting device as in claim 9, wherein the ultraviolet light that excites the self-activating phosphor has a wavelength of about 260 nm.

13. The light emitting device as in claim 9, wherein the light producing element comprises a Hg plasma lamp.

14. The light emitting device as in claim 9, wherein the rare earth element comprises europium.

15. The light emitting device as in claim 9, wherein M represents Al, Ga, or a mixture thereof from about 90 mole % to about 100 mole % combined with from about 0 mole % to about 10 mole % of W, Mo, Bi, or a mixture thereof.

* * * * *